United States Patent
Chang et al.

(10) Patent No.: US 6,252,258 B1
(45) Date of Patent: Jun. 26, 2001

(54) HIGH POWER RECTIFIER

(75) Inventors: Hsueh-Rong Chang, Thousand Oaks; Rajesh Gupta, Newbury Park, both of CA (US)

(73) Assignee: Rockwell Science Center LLC, Thousand Oaks, CA (US)

(*) Notice: Subject to any disclaimer, the term of this patent is extended or adjusted under 35 U.S.C. 154(b) by 0 days.

(21) Appl. No.: 09/371,740

(22) Filed: Aug. 10, 1999

(51) Int. Cl.[7] ............... H01L 31/111; H01L 29/072
(52) U.S. Cl. ............... 257/133; 257/658; 257/119; 257/128; 257/427
(58) Field of Search ............... 257/658, 471, 257/606, 481, 493, 605, 109, 119–138, 427

(56) References Cited

U.S. PATENT DOCUMENTS 4,982,260 * 1/1991 Chang et al. ............... 357/38
5,488,236 * 1/1996 Baliga et al. ............... 257/132

OTHER PUBLICATIONS

Baliga, B. Jayant. *Power Semiconductor Devices*, pp 153–154 and 575–577. Boston, MA:PWS Publishing Company, 1996.

* cited by examiner

*Primary Examiner*—Minh Loan Tran
*Assistant Examiner*—Leonardo Andujar
(74) *Attorney, Agent, or Firm*—Koppel & Jacobs

(57) ABSTRACT

A high power rectifier device has an – drift layer on an N+ layer. A number of trench structures are recessed into the drift layer opposite the N+ layer; respective mesa regions separate each pair of trenches. Each trench structure includes oxide side-walls and an oxide bottom, and is filled with a conductive material. A metal layer contacts the trench structures and mesa regions, forming Schottky contacts at the metal-mesa interface. Shallow P regions extend from the bottom of each trench into the drift layer. Forward conduction occurs when the Schottky contact's barrier height is overcome. When reversed-biased, depletion regions form around the shallow P regions and the oxide side-walls which provide potential barriers across the mesa regions that shield the Schottky contacts from high electric fields, providing a high reverse blocking voltage and reducing reverse leakage current. The device's unipolar structure provides low switching losses, enabling high switching speeds while reducing the power that must be dissipated when transitioning from forward conduction to reverse blocking mode.

39 Claims, 8 Drawing Sheets

HIGH POWER RECTIFIER

BACKGROUND OF THE INVENTION

1. Field of the Invention

This invention relates to the field of high power rectifiers.

2. Description of the Related Art

Semiconductor devices are increasingly required to accommodate high currents and/or high voltages without failing. For example, a variable speed pulse-width modulated (PWM) motor control circuit typically employs a number of transistors as switches, each of which has a flyback rectifier connected across it; the switches are closed in sequence to provide variable frequency AC power to a motor. The rectifier in this type of application is required to conduct a large current when forward-biased, and to block a high voltage when reverse-biased. To maximize the efficiency of the control circuit, the flyback rectifier ideally has a low forward voltage drop $V_{FD}$. The rectifier should also have a small stored charge $Q_{TT}$, to reduce switching loss and to increase switching speed, and a "soft" recovery with a small peak reverse current $I_{RP}$, to reduce the stress on the associated switching devices.

A number of power rectifier devices have been used to provide the high current and reverse blocking characteristics needed for such a high power application. One such device, the P-i-N rectifier, is shown in FIG. 1. An – drift layer 10 is between an N+ layer 12 and a P+ layer 14 (X+ denotes a carrier concentration of at least $1 \times 10^{18}/cm^3$, X– denotes a carrier concentration of less than $5 \times 10^{16}/cm^3$). Metal on the P+ and N+ layers provide the rectifier's anode 16 and cathode 18, respectively.

When forward-biased, P+ region 14 injects large numbers of minority carriers into drift region 10, greatly lowering the resistance of the drift region and allowing the rectifier to carry a high current density. The P-i-N rectifier's drift region 10 is usually thick, resulting in a high "blocking voltage"; i.e., the reverse voltage which the rectifier can accommodate without breaking down. These characteristics make the P-i-N rectifier useful for high power applications.

The P-i-N rectifier has several drawbacks, however. As described in J. Baliga, *Power Semiconductor Devices*, PWS Publishing Co. (1996) at p. 153, the P-i-N rectifier suffers from a "forward voltage overshoot" phenomenon, in which its $V_{FD}$ at turn-on is higher than it is under steady-state conditions. This can be a serious problem in power circuit because the higher $V_{FD}$ may appear across the emitter-base junction of a bipolar transistor used as an active element and exceed its breakdown voltage.

Another drawback of the P-i-N rectifier is its poor reverse recovery characteristic—as described in Baliga (ibid.) at p. 154. Reverse recovery occurs when the rectifier is switched from its on-state to its reverse blocking state. To undergo this transition, the minority carrier charge stored in the drift region during forward conduction must be removed, which requires the injected minority carriers to recombine with majority carriers. During recombination, some reverse current flows through the device before eventually decaying to zero Because so many holes are injected into the drift region during forward conduction, recombination proceeds slowly in a P-i-N rectifier and thereby produces a poor reverse recovery characteristic with a large $I_{RP}$ and large voltage overshoot. This poor reverse recovery characteristic adds a considerable amount of stress to the power switches the rectifier is typically connected across, and requires the rectifier to dissipate a significant amount of power when transitioning to a reverse blocking state.

SUMMARY OF THE INVENTION

A rectifier device is presented that overcomes the problems noted above. The rectifier is particularly well-suited to high power switching applications, providing a high current density and reverse blocking voltage, while exhibiting very low switching losses.

The novel rectifier device has an – drift layer on an N+ layer. A pair of trenches are recessed into the drift layer opposite the N+ layer; the trenches are separated by a mesa region. Oxide layers line the walls and bottom of each trench. A shallow P region extends from the bottom of each trench into the drift layer and around the corners formed at the intersections of its respective trench's oxide side-walls and its bottom. The rectifier's anode is provided by a metal layer that contacts conductive material in the two trenches and the mesa region; metal on the structure's N+ layer serves as the device's cathode.

The interface between the anode and the mesa region provides a Schottky contact. Forward conduction begins when a voltage is applied across the device sufficient to overcome the Schottky barrier height, which allows current to flow from anode to cathode via the Schottky contact. When reversed-biased, depletion regions form around the shallow P regions and the oxide side-walls which provide a potential barrier across the mesa region that shields the Schottky contact from a high electric field, thereby providing a high reverse blocking voltage and greatly reducing reverse leakage current. The device is unipolar; as such, its reverse recovery time is negligible, which enables it to switch from forward conduction to reverse blocking mode very quickly. This also enables the rectifier to exhibit very low switching losses—i.e., very little power is dissipated when transitioning from an on-state to a blocking state.

The rectifier's N– drift and N+ layers may be conventional silicon (Si) but are preferably made from semiconductor materials having a bandgap voltage higher than that of silicon, such as silicon carbide (SiC), gallium nitride (GaN), gallium arsenide (GaAs), or diamond. The use of a material with a higher bandgap voltage enables the use of a drift layer that, for the same blocking voltage, is much thinner than would be necessary with an Si implementation. These materials also permit the drift region's doping density to be much higher than an Si version capable of providing the same blocking voltage, which reduces the device's on-resistance.

The trench structures enable both the trench width and the width of the mesa region to be precisely controlled, permitting the forward voltage drop and reverse blocking characteristics to be tailored to the demands of a particular application. A number of such structures are fabricated in parallel to provide a desired current carrying capacity.

Further features and advantages of the invention will be apparent to those skilled in the art from the following detailed description, taken together with the accompanying drawings.

DETAILED DESCRIPTION OF THE INVENTION

Figure 2:
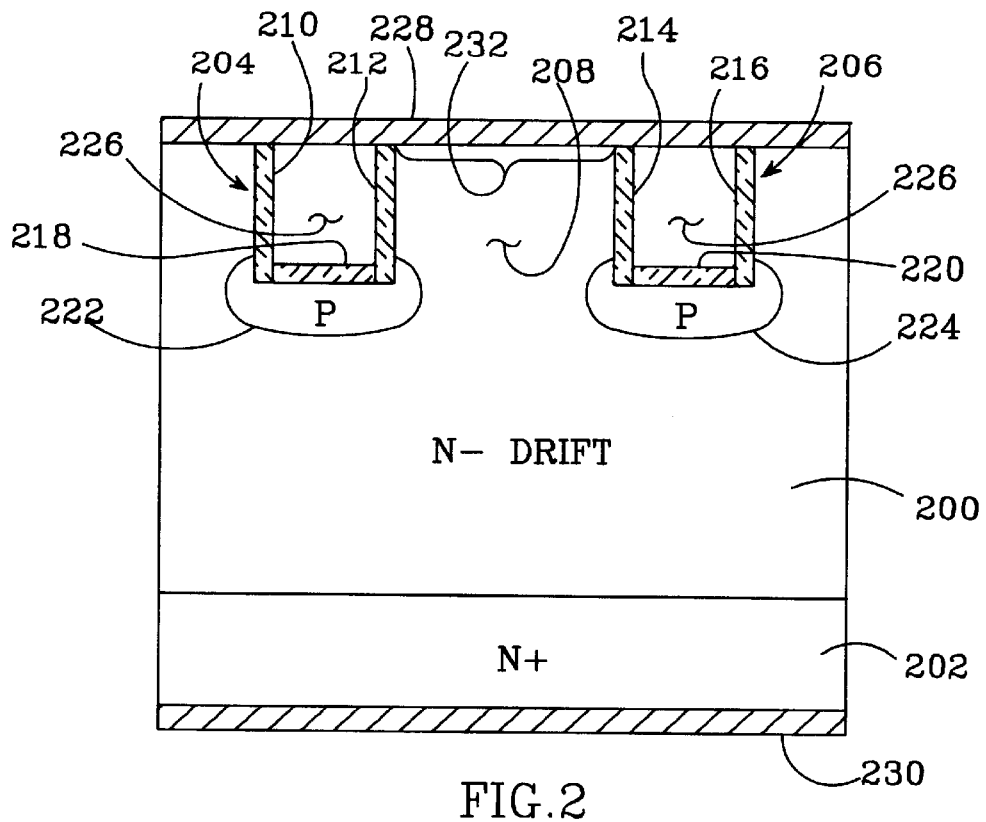
FIG. 2 is a sectional view of one embodiment of a rectifier per the present invention.

An exemplary view of one embodiment of a rectifier in accordance with the present invention is shown in FIG. 2. A N– drift layer 200 of a desired thickness is on an N+ layer 202. Recessed into drift layer 200 opposite the N+ layer are a pair of trenches 204, 206, which are separated by a mesa region 208 comprised of that portion of drift layer 200 found between trenches 204 and 206. Each of the trenches has oxide side-walls 210, 212, 214 and 216. Each trench also has a layer of oxide 218, 220 lining its bottom. Shallow P regions 222, 224 extend from the bottom of each trench into the drift layer and around the corners formed at the intersections of its respective trench's oxide side-walls and its bottom; a conductive material 226 is inside of each trench. A metal layer 228 contacts the mesa region 208, as well as the side-walls 210, 212, 214, 216 and the conductive material 226 within the two trenches 204, 206. Another metal layer 230 contacts N+ layer 202.

The structure shown in FIG. 2 forms a majority-carrier Schottky rectifier, with metal layers 228 and 230 serving as anode and cathode, respectively. The interface between metal layer 228 and mesa region 208 forms a Schottky contact 232.

Figure 3:
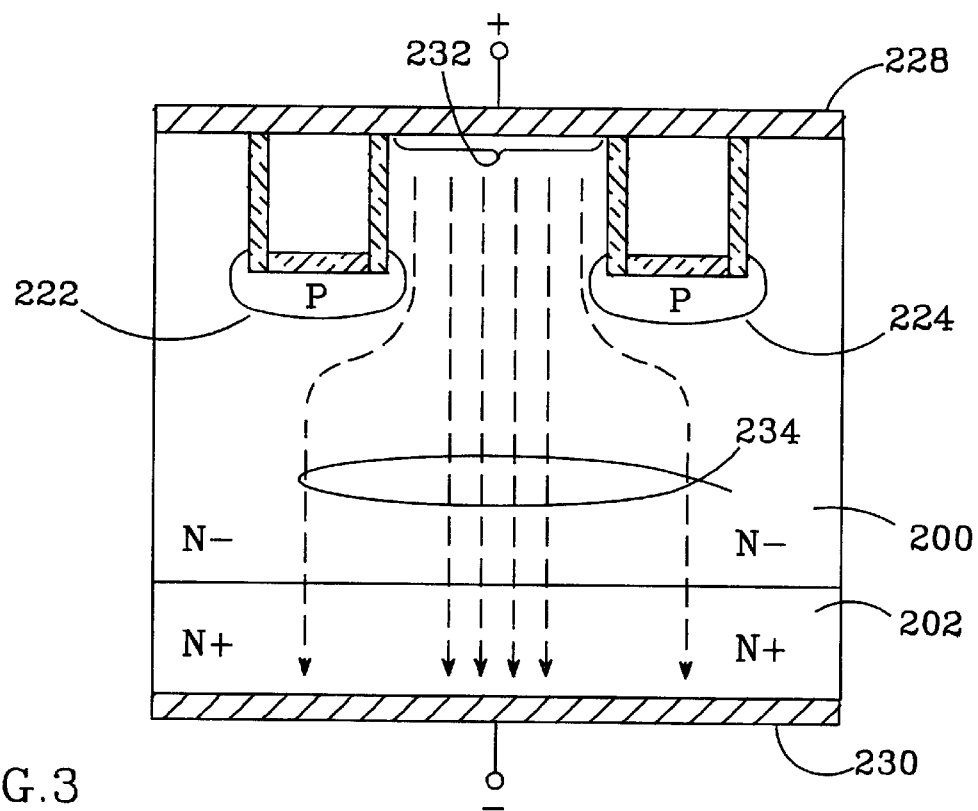
FIG. 3 is a sectional view of the rectifier of FIG. 2, illustrating its operation when forward-biased.

The operation of the rectifier when forward-biased is illustrated in FIG. 3. When the voltage applied to anode 228 with respect to that applied to cathode 230 is high enough to overcome the barrier height of the Schottky contact 232 (about 0.6–1.5 volts depending on the anode metal and semiconductor material), current 234 can flow from anode 228 to cathode 230 via the Schottky contact. Because the barrier height of the Schottky contact is less than that of a P-N junction, the novel rectifier provides a lower forward voltage drop $V_{FD}$ than would be attainable in a conventional P-N junction rectifier.

Figure 4:
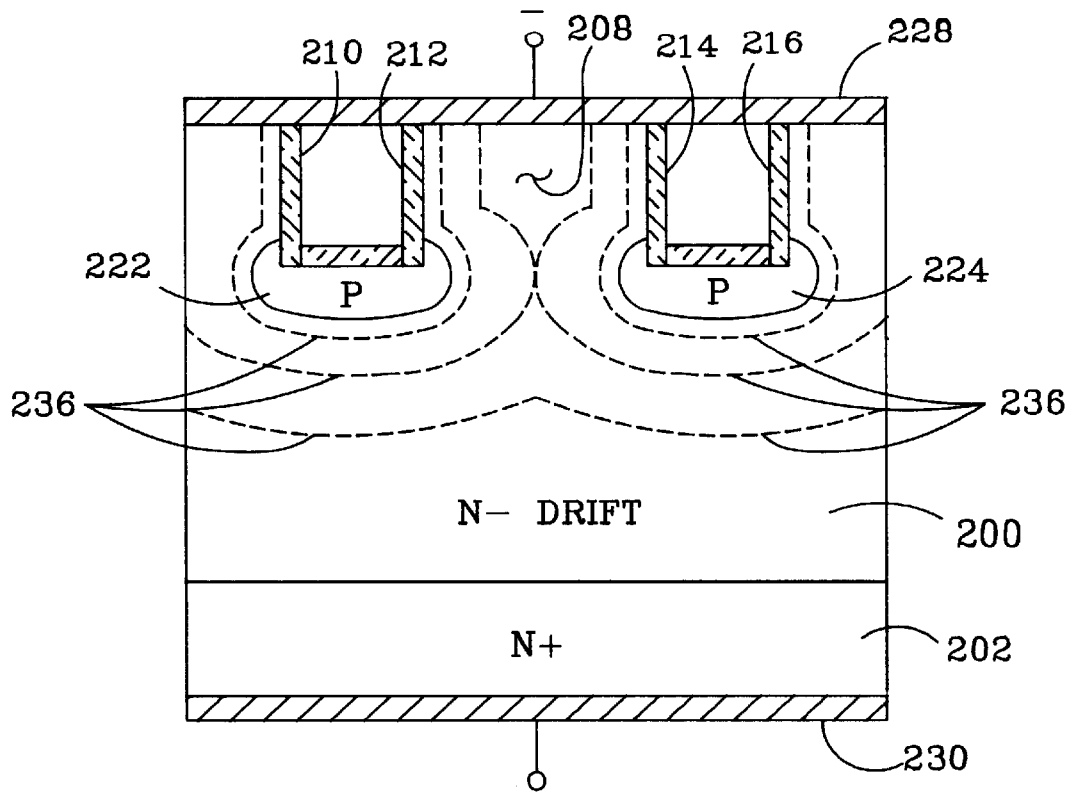
FIG. 4 is a sectional view of the rectifier of FIG. 2, illustrating its operation when reverse-biased.

The operation of the rectifier when reverse-biased, i.e., with the voltage on cathode 230 greater than that applied to anode 228, is illustrated in FIG. 4. As the voltage across the device falls below $V_{FD}$, depletion regions 236 begin to form around the buried P regions 222 and 224, as well as around the oxide side-walls 210, 212, 214, 216 of the trenches. As the depletion regions grow, they merge and form a potential barrier across mesa region 208, which shields Schottky contact 232 from the high electric field imposed by the voltage across the device. This inhibits the barrier height lowering effect, and thus enables the device to achieve a very low reverse leakage current. Because the shallow P regions extend around the trench corners, they protect the corners from premature breakdown caused by high electric fields; this improves the reliability of the trench oxide and enhances the robustness of the rectifier's breakdown voltage characteristic.

The oxide side-walls 210, 212, 214, 216 of trenches 204 and 206 prevent the diffusion of P type dopant sideways, and the P regions at the bottom of the trenches are made shallow to reduce lateral diffusion. Recessing the shallow P regions into drift layer 200 and below the Schottky contact, together with the oxide side-walls, serves to make the voltage of the reverse-bias-induced potential barrier higher than that found in prior art devices, greatly improving its shielding effectiveness.

Because the novel rectifier is a majority carrier device, there is no recombination of carriers needed to turn-off the device. This makes the rectifier's reverse recovery time negligible, and enables it to switch from forward conduction to reverse blocking mode very quickly. Furthermore, with voltage overshoot and reverse current virtually eliminated by the unipolar structure, very little power is dissipated when transitioning from an on-state to a blocking state. As a result, the rectifier's switching losses are very low.

The trenches are preferably recessed vertically into the N– drift region; i.e., with their side-walls approximately perpendicular to the top surface of the drift layer 200. However, the invention is not limited to vertically-recessed trenches: each trench may be wider at the top than it is at the bottom, or vice versa. Trenches that are wider at the top than at the bottom make the mesa region wider between the trench bottoms, which tends to lower the rectifier's forward voltage drop but may degrade its blocking voltage. Trenches that are wider at the bottom constrict the mesa region, which may increase the forward voltage drop but improve blocking voltage. Vertically-recessed trenches provide a good balance between forward voltage drop and blocking voltage, and are preferred.

Referring back to FIG. 2, conductive material 226 is preferably polysilicon which has been heavily doped with acceptors. Polysilicon is preferred because it easily fills the trenches, but other materials that can fill the trenches and provide good conductivity could also be used. The trenches preferably have a depth of between about 1 $\mu$m and 3 $\mu$m. The shallow P regions are preferably between about 0.3–0.5 $\mu$m deep to limit lateral diffusion. N– drift layer 200 is typically doped to a density of about $5 \times 10^{15}$ carriers/cm$^3$. Shallow P regions 222 and 224 are typically doped with an activated charge of about $1 \times 10^{12}$ carriers/cm$^2$, depending on the blocking voltage required.

Figure 5:
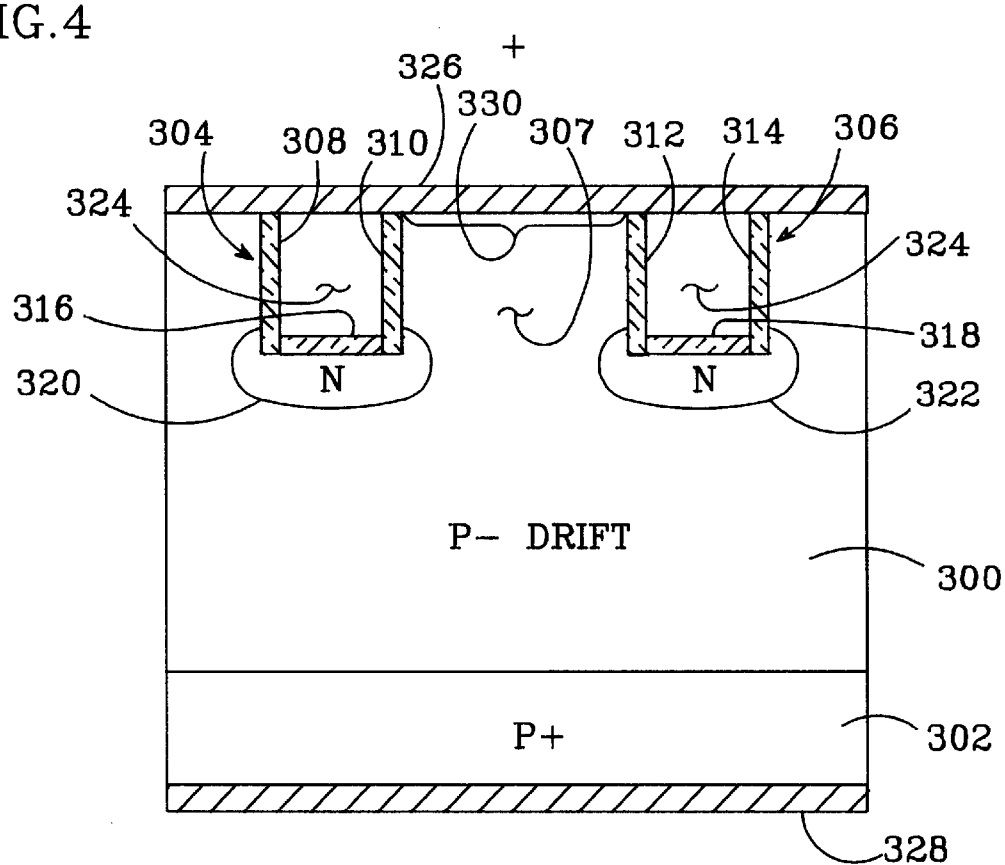
FIG. 5 is a sectional view of an opposite polarity version of the rectifier of FIG. 2.

An opposite polarity version of the rectifier of FIG. 2 is shown in FIG. 5, in which each of the materials has been swapped with its opposite polarity counterpart. Here, a P+ drift layer 300 is on a P+ layer 302, and a pair of trenches 304, 306 are recessed into the drift layer opposite the P+ layer; the trenches are separated by a mesa region 307. Each trench has oxide side-walls 308, 310 312, 314, an oxide bottom 316, 318, and a respective shallow N region 320, 322 extending from its bottom into drift layer 300. The trenches are filled with a conductive material 324—preferably polysilicon which has been heavily doped with donors. A metal layer 326 contacts mesa region 307 and the side-walls 308, 310, 312, 314 and conductive material 324 in each trench, and another metal layer 328 contacts the P+ region. The interface between metal layer 326 and mesa region 307 forms a Schottky contact 330. In this embodiment, metal layer 328 serves as the rectifier's anode and metal layer 326 serves as its cathode. Operation of the device is analogous to that of FIG. 2, except that in this embodiment, holes are the majority carriers rather than electrons, and the direction of forward conduction is reversed.

When the rectifier is required to have a high blocking voltage, its material layers are preferably made from a semiconductor material having a bandgap voltage that is higher than that of silicon, such as silicon carbide (SiC), gallium nitride (GaN), gallium arsenide (GaAs), or diamond. The peak electric field that a material can withstand without breaking down is defined as its "critical field", which is proportional to the material's bandgap voltage. For example, an SiC layer (bandgap voltage of 3.26 ev versus 1.1 ev for Si) is able to sustain a peak field that is about 10 times greater than that supportable by an Si layer of comparable thickness. In addition, the doping concentration a material is capable of attaining is proportional to its critical field. Thus, SiC's higher critical field enables the rectifier's material layers to have a doping density that is an order of magnitude higher than is possible with Si alone (~$5 \times 10^{15}$ vs. ~$8 \times 10^{13}$ carriers/cm$^3$). This higher doping density lowers the device's $V_{FD}$ when compared with an Si implementation. SiC's higher doping density also permits the drift layer 200 to be, for a given blocking voltage, an order of magnitude thinner than would be needed for an Si implementation. For example, a 1200 volt blocking voltage could be provided with a drift layer made from Si having a doping density of about $8 \times 10^{13}$ carriers/cm$^3$ which is about 120 $\mu$m thick, or with an SiC drift layer having a doping density of about $5 \times 10^{15}$ carriers/cm$^3$ which is about 12 $\mu$m thick.

Use of a semiconductor material with a bandgap voltage higher than that of Si also reduces reverse leakage current. For example, SiC's wide bandgap enables a material layer's reverse leakage current to be several orders of magnitude less than an Si layer of comparable thickness. This factor also serves to increase the temperature at which the rectifier can be operated. Because reverse leakage current increases exponentially with temperature, conventional devices must be operated at lower temperatures to achieve leakage currents comparable to those provided by an SiC implementation. Conversely, an SiC-based rectifier can be operated at higher temperatures while still meeting a given reverse leakage current specification.

As noted above, a wide bandgap material is preferred when a high blocking voltage is required However, a rectifier as described herein and implemented with Si would also be useful, as long as the blocking voltage it is required to withstand is no more than about 200–300 volts.

As noted above, the P regions are made shallow to limit lateral diffusion. To further limit lateral diffusion, it is preferred that the P regions comprise a slow-diffusing material. For an SiC implementation of the rectifier, the preferred material for the shallow P regions is aluminum.

It may be advantageous to have the doping concentration in the mesa region 208 be higher than it is in the portion of drift layer 200 below the mesa. A doping concentration in the mesa region that is about 4 times that of the rest of the drift region further lowers the device's on-resistance, while having very little effect on blocking voltage. This is because the oxide side-walls of trench gates 204 and 206 act as field plates, which cause the peak of the electric field induced by a reverse voltage across the device to be more evenly distributed across the mesa, effectively lowering the peak field in the mesa region. Thus, a higher doping concentration in the mesa region lowers on-resistance without sacrificing blocking voltage.

It is not essential, however, that the mesa region's doping density be greater than that in the rest of the drift layer—it may also be equal to or less than that in the drift layer. Making the doping density in the mesa region less than that in the rest of the drift layer improves the rectifier's blocking voltage and reduces its leakage current, but this benefit comes at the expense of a higher forward voltage drop.

Careful consideration must be given to the width of the mesa region. If a mesa is too narrow, lateral diffusion around the P regions may act to pinch off the conductive path and block current flow. If too wide, the reverse blocking voltage may be adversely affected. For example, a mesa width of about 2–4 $\mu$m, separating trenches that are each about 1–1.5 $\mu$m wide, provides a blocking voltage of about 1200 volts while keeping on-resistance low.

Figure 6A:
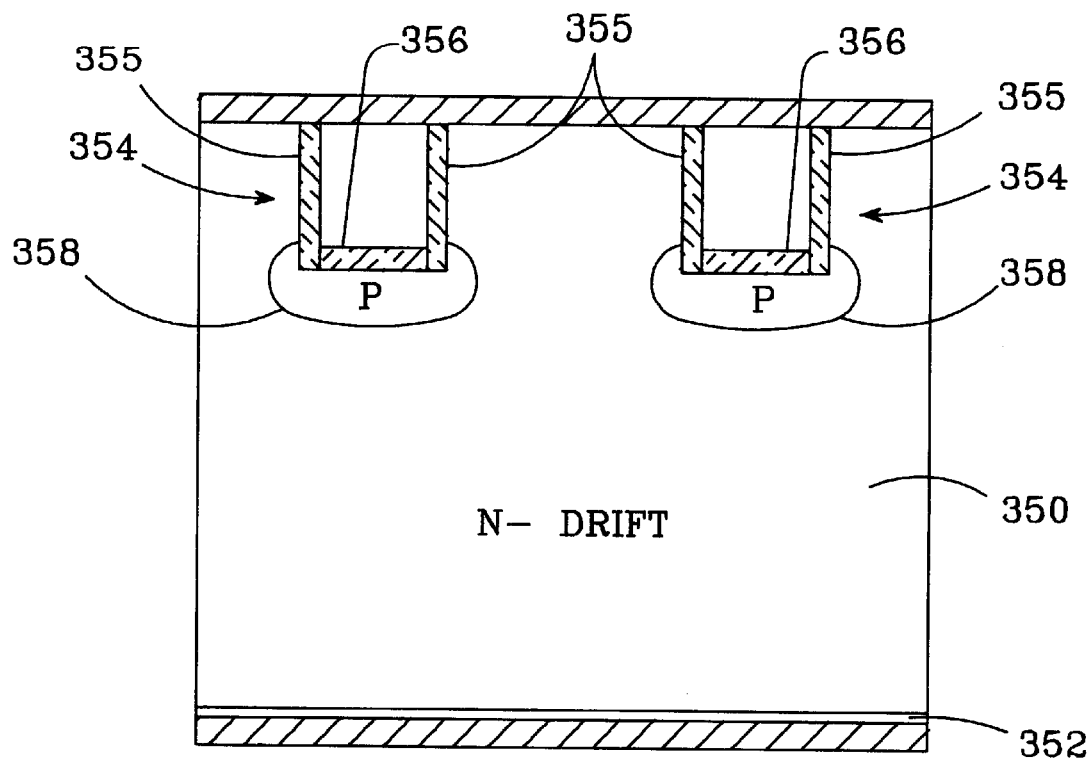
FIG. 6a is a sectional view of an alternative embodiment of a rectifier per the present invention.

The rectifier can be fabricated on punch-through wafers (EPI), in which the drift layer is an epitaxial layer grown to a desired thickness on a bulk substrate material (as depicted in FIG. 2, with epitaxial drift layer 200 on N+ bulk substrate 202), or on non-punch-through (NPT) wafers. An exemplary structure using an NPT wafer is shown in FIG. 6a. Here, the N– drift region 350 is a bulk substrate material, and the N+ layer 352 is a very thin layer (0.5 $\mu$m or less) of a material having a large supply of donors, such as phosphorus or nitrogen, which has been implanted or diffused into the backside to provide a low resistance ohmic contact; the rest of the structure is similar to that shown in FIG. 2, with a pair of trenches 354 with oxide side-walls 355 and oxide bottoms 356, and shallow P regions 358 recessed into drift layer 350.

Several factors should be considered when determining which wafer-type to use. EPI wafers are more expensive that NPT wafers, but because the N-epitaxial layer has a controlled thickness and doping concentration, it offers a lower forward voltage drop.

Figure 6B:
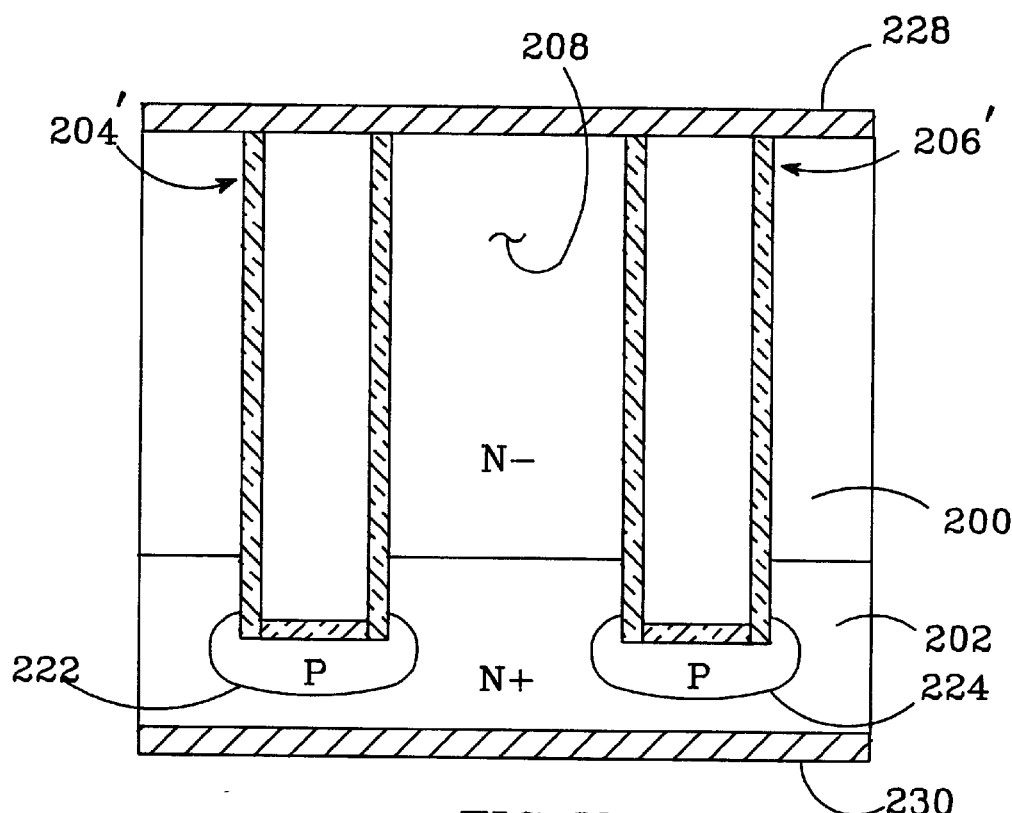
FIG. 6b is a sectional view of another alternative embodiment of a rectifier per the present invention.

Another possible embodiment of the present rectifier is shown in FIG. 6b. This structure is similar to that shown in FIG. 2, except for the depth of the trenches 204' and 206'. Instead of having the trench bottoms and their corresponding P regions reside in the N– drift layer 200, the trenches and their P regions extend through drift layer 200 and into the N+ layer 202.

Figure 6C:
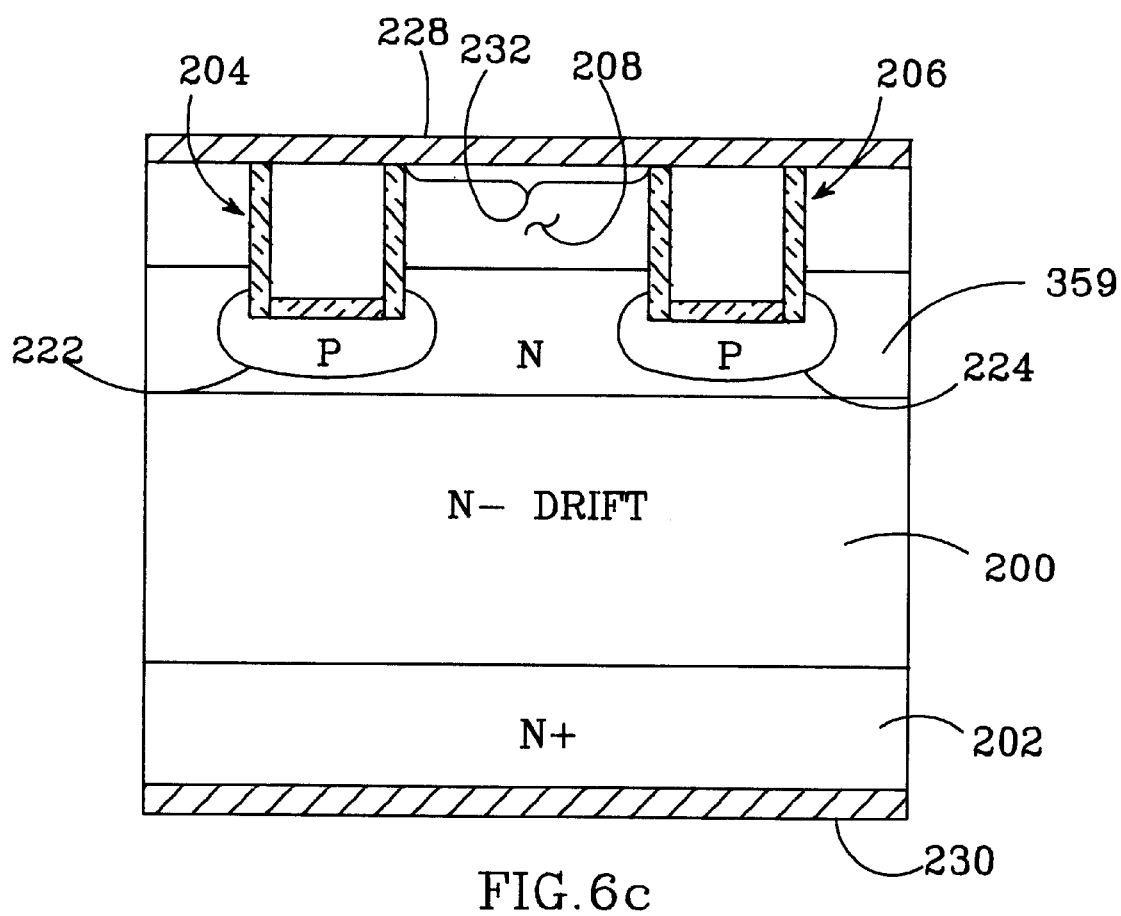
FIG. 6c is a sectional view of another alternative embodiment of a rectifier per the present invention.

Another embodiment of the rectifier is shown in FIG. 6c. This structure is similar to that of the device in FIG. 2, except for the addition of an N type layer 359 which completely envelops P regions 222 and 224. Because N type layer 359 is more heavily doped than N– drift layer 200, it reduces the out-diffusion of P material from P regions 222 and 224, thereby reducing the rectifier's forward voltage drop. The portion of mesa region 208 found between N type layer 359 and anode 228 may be doped to the same level as the N– drift layer 200; for this embodiment, however, it is preferred that this portion of mesa region 208 be more lightly doped than N– drift layer 200 (as discussed above). The increase in $V_{FD}$ a more lightly-doped mesa might otherwise cause is compensated for by the improved $V_{FD}$ brought about by N layer 359.

To provide a high power rectifier, the structures of FIGS. 2, 5, 6a or 6b are repeated across a die having an area sufficient to provide the necessary current carrying capacity.

Figure 7:
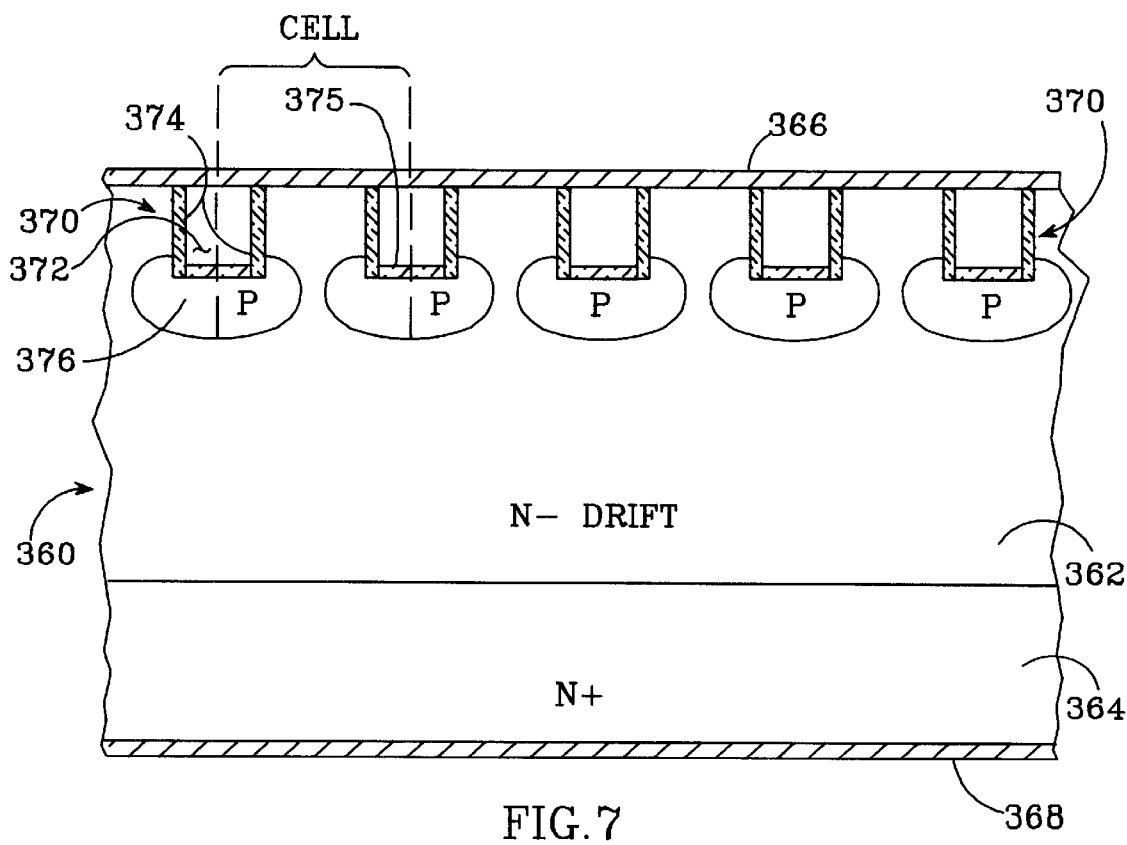
FIG. 7 is a cross-sectional view of a multiple-cell implementation of a rectifier per the present invention, cut along section lines 7—7 in FIGS. 8, 9a and 9b.

This is illustrated in the cross-sectional view shown in FIG. 7 of an exemplary high power rectifier. A die 360 has an N− drift layer 362 on an N+ layer 364, sandwiched between metal layers 366 and 368; each of these layers runs approximately the full length and width of the die. A number of trench structures 370 are spaced periodically across the die, each of which is similar to the trenches shown in FIG. 2—filled with a conductive material 372 and having oxide side-walls 374 and an oxide bottom 375, and a shallow P region 376 at its bottom. The area from the midpoint of one trench structure to the midpoint of an adjacent trench structure is referred to as a "cell". The halves of the adjacent trenches which are within each cell function as described above: forward conduction begins when the voltage across the device overcomes the barrier height of the Schottky contacts. When the device is reversed-biased, depletion regions form around each trench structure, which merge to form potential barriers across the mesa regions which shield the Schottky contacts.

Figure 8:
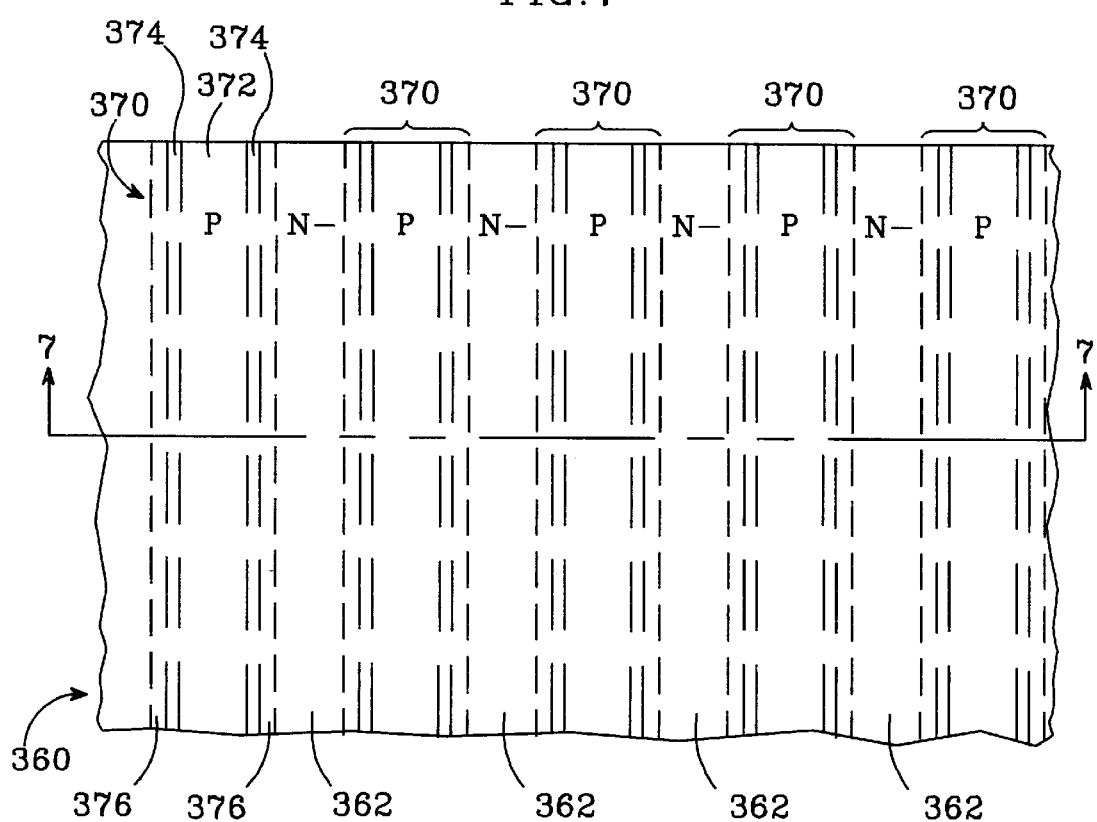
FIG. 8 is a plan view of one embodiment of a multiple-cell implementation of a rectifier per the present invention.

The trench structures may be arrayed across the die in a wide variety of ways. One arrangement is illustrated in FIG. 8, which is a plan view that corresponds with the cross-sectional view of FIG. 7 (metal layers 366, 368, N+ layer 364 and oxide bottoms 375 not shown for clarity). The trench structures 370 form channels that run the length of the die 360 and are spaced periodically across its width, with a shallow P region 376 below each trench bottom.

Figure 9A:
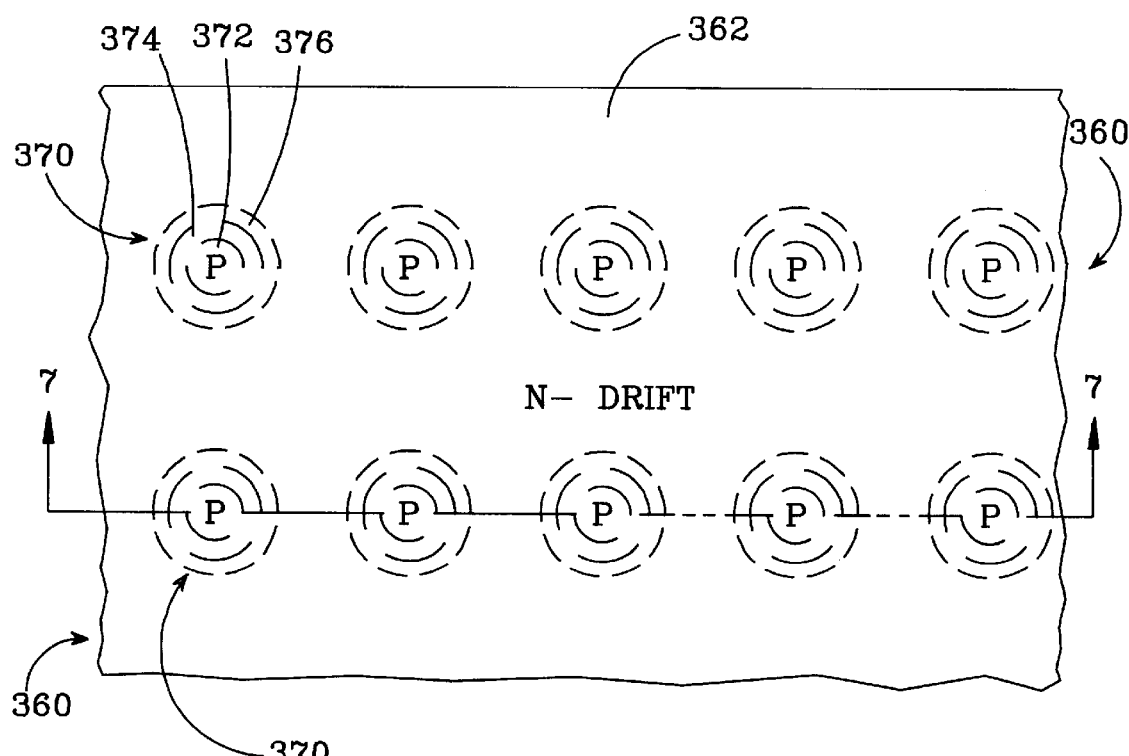
FIG. 9a is a plan view of another embodiment of a multiple-cell implementation of a rectifier per the present invention.

Another possible trench structure arrangement is shown in FIG. 9a, which also corresponds with the cross-sectional view of FIG. 7. Here, the trenches 370 (with trench walls 374) and their corresponding P regions 376 are cylindrical in shape, and are spaced periodically within the die 360. Note that an alternative arrangement to that shown in FIG. 9a is also possible, in which the P regions and the mesa regions are reversed. The Schottky contacts could be circular in shape, surrounded by cylindrical oxide side-walls, and spaced periodically within the die 360, with the P regions recessed in the areas between the Schottky contacts.

Figure 9B:
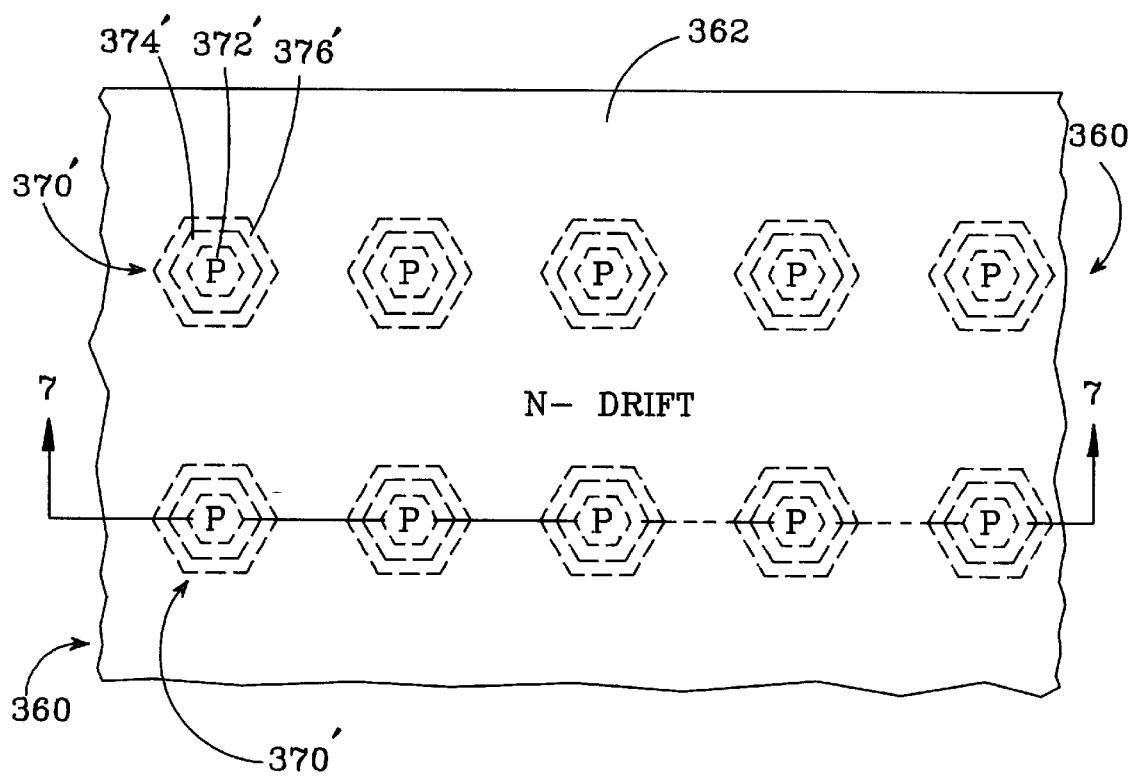
FIG. 9b is a plan view of yet another possible embodiment of a multiple-cell implementation of a rectifier per the present invention.

The perimeter of each of the trenches may also describe a polygon. One possible example of this is illustrated in FIG. 9b, which also corresponds with the cross-sectional view of FIG. 7. Here, the trenches 370' (with trench walls 374') and their corresponding P regions 376' are hexagonal in shape, and are spaced periodically within the die 360.

The trench structure arrays shown in FIGS. 7–9b are merely exemplary; many other possible trench geometries and arrangements are possible which will result in rectifiers that adhere to the principles of the invention. It is recommended that square-shaped trenches be avoided, because the high peak fields that appear at the trench corners can result in the premature breakdown of the device.

A "termination" typically surrounds an array of cells as described above, to protect the cells on the outer edges of the array. For the present rectifier, it is preferable that the termination depth extend well into the drift layer. This serves to better protect the outlying trench structures, and reduces the sharpness of the termination's corners, which enhances the termination's ability to protect the trenches from high electric fields.

When the drift layer is N type material, the termination is typically P type. Thus, the termination may be formed with the same P type material as is used for the buried P regions below each trench. This is not recommended for an SiC implementation, however: aluminum is the preferred material for the P regions, because it is slow-diffusing in SiC and can thus limit lateral diffusion. The termination, on the other hand, is preferably fast-diffusing. As such, a fast-diffusing material such as boron is preferred for the termination around an SiC device.

As noted above, a high power rectifier is provided by employing an array of rectifier cells across a die. For example, when so arranged, a rectifier as described herein can carry a forward current of at least 50 A with a die having a surface area of about 0.1 cm$^2$.

The rectifier described herein provides a fast switching speed and low switching losses, and can also withstand a high blocking voltage when fabricated with semiconductor materials having a high bandgap voltage. These characteristics make the rectifier desirable for many applications, two of which are discussed below.

Figure 1:
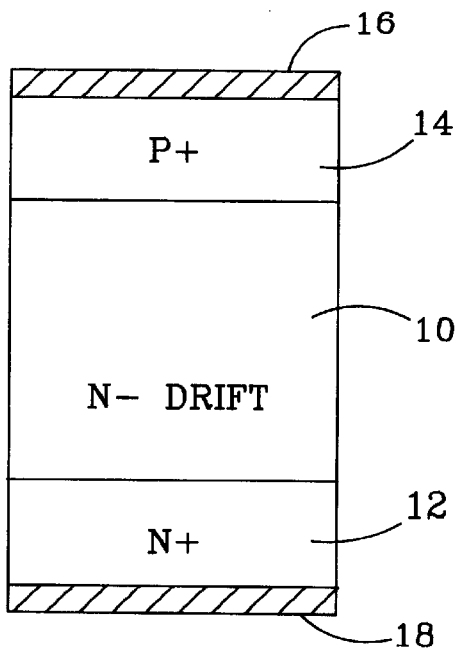
FIG. 1 is a sectional view of a P-i-N rectifier known in the prior art.
Figure 10:
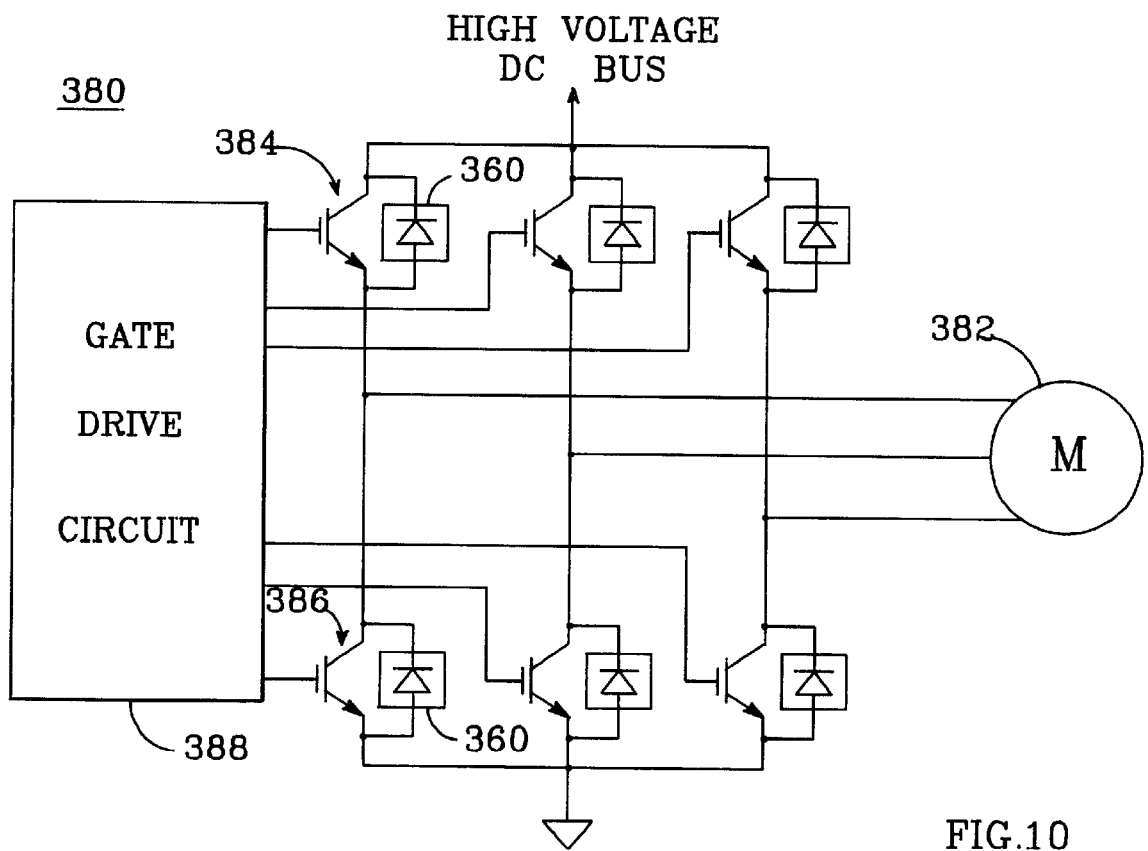
FIG. 10 is a schematic diagram of pulse-width modulated motor control circuit employing rectifiers per the present invention.

One application of a rectifier per the present invention is illustrated in FIG. 10. As described in J. Baliga (ibid.) at p. 575–577, a PWM motor control circuit 380 provides variable frequency AC power to a 3-phase AC motor 382 using six switching transistors and six flyback diodes. Each switch is made from two transistors connected in a totem-pole configuration: one switch (typical of all the switches), is made from a pair of transistors 384, 386 connected in series between a high voltage DC bus and ground, with a flyback diode 360 per the present invention connected across each transistor. The switching transistors are driven by a gate drive circuit 388, which regulates power to the motor by adjusting the time duration for the on and off states of each switch. In a motor control circuit application, insulated-gate bipolar transistors (IGBTs) are typically used for the switching transistors, due to their high reverse blocking voltage and excellent switching characteristics, and because they do not require a snubber circuit. Rectifiers 360 per the present invention are well-suited for use in the motor control circuit, due to their superior switching and reverse blocking characteristics. These factors combine to improve the efficiency of the motor control circuit, while reducing the stress on the switching transistors.

Figure 11:
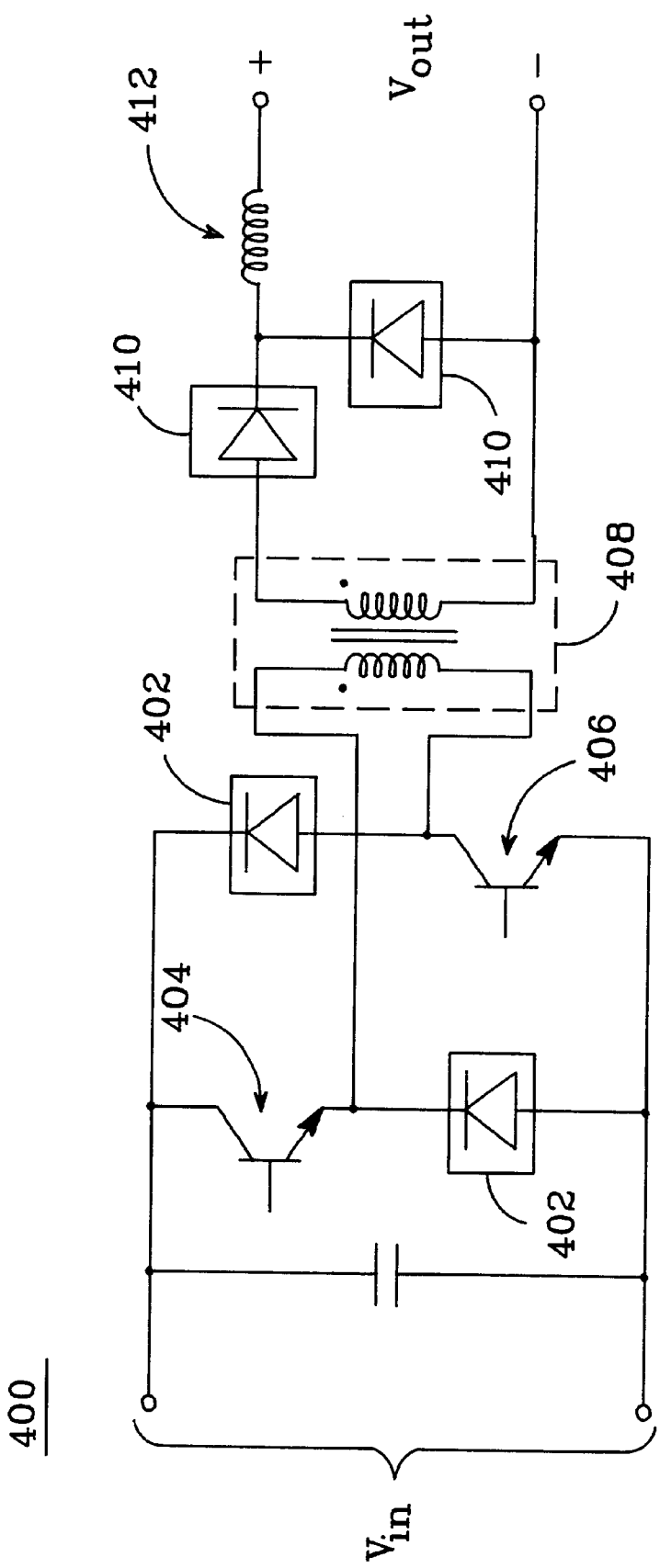
FIG. 11 is a schematic diagram of switching voltage regulator employing rectifiers per the present invention.

Another suitable application for the present rectifier is shown in FIG. 11, which depicts a basic switching voltage regulator 400. Two rectifiers 402 per the present invention are employed on the primary side of the regulator, connected in series with respective switching transistors 404 and 406; both transistor/rectifier branches are connected across an input voltage $V_{in}$. The switching transistors 404, 406 conduct a current through the primary side of a transformer 408 when switched on, and the rectifiers 402 conduct the transformer current when the transistors are switched off. An output circuit is connected to the secondary side of transformer 408, which includes two rectifiers 410 per the present invention (though typically having a different breakdown voltage characteristic than rectifiers 402) and an output inductor 412. The output circuit is arranged to rectify the voltage across the secondary side of transformer 408 and to produce a rectified output voltage $V_{out}$ from the regulator. The rectifiers' fast switching speed and low switching losses make it well-suited for use in switching regulator applications.

The high power rectifier is fabricated using conventional means well-known to those in the art of semiconductor fabrication. Though the device's trench structures require processing steps that are not necessary when fabricating other rectifier types, such as a P-i-N rectifier, the additional fabrication complexity is offset by the greatly improved performance of the device when used in high power applications.

While particular embodiments of the invention have been shown and described, numerous variations and alternate embodiments will occur to those skilled in the art. Accordingly, it is intended that the invention be limited only in terms of the appended claims.

We claim:

1. A rectifier device, comprising:
   an N+ layer;
   a first layer of metal on said N+ layer providing a cathode connection point for said rectifier device;
   an N− drift layer on said N+ layer opposite said cathode;
   a pair of trenches recessed into said drift layer opposite said N+ layer, said trenches separated by a mesa region comprised of that portion of said N− drift layer found between said pair of trenches;
   a layer of oxide lining the sides and bottom of each of said trenches to form oxide side-walls and respective oxide bottoms in each trench;
   respective shallow P regions extending from the oxide bottoms of respective trenches into said N− drift layer, each of said shallow P regions extending around the corners formed at the intersections of its respective trench's oxide side-walls and oxide bottom;
   a conductive material in each of said trenches; and
   a second layer of metal contacting said mesa region, said conductive material, and said oxide side-walls, said second layer of metal forming a Schottky contact at its interface with said mesa region, said second layer of metal providing an anode connection point for said rectifier device;
   said device structure arranged such that a voltage applied across said anode and cathode which is greater than the barrier height of said Schottky contact allows current to flow from said anode to said cathode via said Schottky contact, and a voltage applied across said anode and cathode which reverse-biases the device produces depletion regions alongside said side-walls and around said shallow P regions which provide a potential barrier across said mesa region that shields said Schottky contact from a high electrical field and thereby reduces reverse leakage current, each of said shallow P regions protecting said trench corners from premature breakdown due to high electric fields and thereby improving the reliability of the trench oxide.

2. The rectifier device of claim 1, wherein said conductive material is polysilicon which has been heavily-doped with acceptors.

3. The rectifier device of claim 1, wherein said shallow P regions are doped with an activated charge of about $1\times10^{12}$ carriers/cm$^2$.

4. The rectifier device of claim 1, wherein said N+ layer is a bulk substrate material and said N− drift layer is an epitaxial layer grown on said N+ layer.

5. The rectifier device of claim 1, wherein said N− drift layer is a bulk substrate material and said N+ layer is implanted or diffused into the backside of said N− drift layer.

6. The rectifier device of claim 1, wherein the depth of each of said trenches is between about 1 $\mu$m and 3 $\mu$m.

7. The rectifier device of claim 1, wherein said shallow P regions are about 0.3–0.5 $\mu$m thick to limit lateral diffusion.

8. The rectifier device of claim 1, wherein the width of each of said trenches is about 1–1.5 $\mu$m and the width of said mesa region is about 2–4 $\mu$m.

9. The rectifier device of claim 1, wherein the structure between the vertical midpoints of each of said trenches comprises a rectifier cell, further comprising a plurality of additional trenches recessed in said drift layer and spaced periodically in said drift layer with said first pair of trenches, each of said additional trenches having oxide side-walls and an oxide bottom and filled with a conductive material, and having a shallow P region extending from its bottom into said drift layer, the conductive material and side-walls in each of said additional trenches contacting said second layer of metal, each of said additional trenches forming an additional one of said rectifier cells, said additional rectifier cells increasing the current carrying capacity of said rectifier device when said device is forward-biased.

10. The rectifier device of claim 1, wherein said N+ layer and said N− drift layer comprise a semiconductor material having a bandgap voltage greater than that of silicon.

11. The rectifier device of claim 10, wherein said N+ layer and said N− drift layer comprise silicon carbide (SiC).

12. The rectifier device of claim 11, wherein said − drift layer has a doping density of about $5\times10^{15}$ carriers/cm$^3$.

13. The rectifier device of claim 11, wherein said N− drift layer has a thickness of about 12 $\mu$m and said rectifier device has a blocking voltage of at least 1200 volts.

14. The rectifier device of claim 11, wherein said shallow P regions comprise aluminum.

15. The rectifier device of claim 10, wherein said N+ layer and said N− drift layer comprise gallium nitride (GaN).

16. The rectifier device of claim 10, wherein said N+ layer and said N− drift layer comprise gallium arsenide (GaAs).

17. The rectifier device of claim 10, wherein said N+ layer and said N− drift layer comprise diamond.

18. The rectifier device of claim 1, wherein the doping density in said mesa region is at least four times greater than the doping density in the portion of said N− drift layer below said mesa region, said higher doping density lowering the on-resistance of said device in said mesa region, said oxide side-walls acting as field plates which reduce the peak field present in said mesa region when said device is in blocking mode such that said higher doping density in said mesa region does not significantly degrade said device's blocking capability.

19. The rectifier device of claim 1, wherein the doping density in said mesa region is less than the doping density in the portion of said N− drift layer below said mesa region, said lower doping density increasing the blocking voltage and reducing the leakage current of said device.

20. The rectifier device of claim 1, wherein said trenches are recessed vertically into said N− drift layer such that said side-walls are approximately perpendicular to the top surface of said drift layer.

21. The rectifier device of claim 1, further comprising an N type layer which completely envelops said shallow P regions, said N type layer lowering the forward voltage drop of said rectifier.

22. A rectifier device, comprising:
   a P+ layer;
   a first layer of metal on said P+ layer providing an anode connection point for said rectifier device;
   a P− drift layer on said P+ layer opposite said anode;
   a first pair of trenches recessed into said drift layer opposite said P+ layer, said trenches separated by a mesa region comprised of that portion of said P− drift layer found between said pair of trenches;
   a layer of oxide lining the sides and bottom of each of said trenches to form oxide side-walls and respective oxide bottoms in each trench;
   respective shallow N regions extending from the oxide bottoms of respective trenches into said P-drift layer, each of said shallow N regions extending around the corners formed at the intersections of its respective trench's oxide side-walls and oxide bottom;

a conductive material in each of said trenches; and a second layer of metal contacting said mesa region, said conductive material, and said oxide side-walls, said second layer of metal forming a Schottky contact at its interface with said mesa region, said second layer of metal providing a cathode connection point for said rectifier device;

said device structure arranged such that a voltage applied across said anode and cathode which is greater than the barrier height of said Schottty contact allows current to flow from said anode to said cathode via said Schottky contact, and a voltage applied across said anode and cathode which reverse-biases the device produces depletion regions alongside said side-walls and around said shallow N regions which provide a potential barrier across said mesa region that shields said Schottky contact from a high electrical field and thereby reduces reverse leakage current, each of said shallow P regions protecting said trench corners from premature breakdown due to high electric fields and thereby improving the reliability of the trench oxide.

23. The rectifier device of claim 22, wherein said conductive material is polysilicon which has been heavily-doped with donors.

24. The rectifier device of claim 22, wherein said P+ layer and said P− drift layer comprise a semiconductor material having a bandgap voltage greater than that of silicon.

25. A rectifier device, comprising:

an N+ layer;

a first layer of metal on said N+ layer providing a cathode connection point for said rectifier device;

an N− drift layer on said N+ layer opposite said cathode;

a pair of trenches recessed into and through said drift layer and into said N+ layer, said trenches separated by a mesa region comprised of that portion of said N− drift layer and said N+ layer found between said pair of trenches;

a layer of oxide lining the sides and bottom of each of said trenches to form oxide side-walls and respective oxide bottoms in each trench;

respective shallow P regions extending from the oxide bottoms of respective trenches into said N+ layer, each of said shallow P regions extending around the corners formed at the intersections of its respective trench's oxide side-walls and oxide bottom;

a conductive material in each of said trenches; and a second layer of metal contacting said mesa region, said conductive material, and said oxide side-walls, said second layer of metal forming a Schottky contact at its interface with said mesa region, said second layer of metal providing an anode connection point for said rectifier device;

said device structure arranged such that a voltage applied across said anode and cathode which is greater than the barrier height of said Schottky contact allows current to flow from said anode to said cathode via said Schottky contact, and a voltage applied across said anode and cathode which reverse-biases the device produces depletion regions alongside said side-walls and around said shallow P regions which provide a potential barrier across said mesa region that shields said Schottky contact from a high electrical field and thereby reduces reverse leakage current, each of said shallow P regions protecting said trench corners from premature breakdown due to high electric fields and thereby improving the reliability of the trench oxide.

26. A high power rectifier device, comprising:

an N+ layer;

a first layer of metal on said N+ layer providing a cathode connection point for said rectifier device;

an N− drift layer on said N+ layer opposite said cathode;

a plurality of trenches recessed into and spaced periodically in said drift layer opposite said N+ layer, each pair of adjacent trenches separated by a respective mesa region comprised of that portion of said N− drift layer found between said pair of adjacent trenches;

a layer of oxide lining the sides and bottoms of each of said trenches to form oxide side-walls and respective oxide bottoms in each trench;

respective shallow P regions extending from the oxide bottoms of respective trenches into said N− drift layer, each of said shallow P regions extending around the corners formed at the intersections of its respective trench's oxide side-walls and oxide bottom;

a conductive material in each of said trenches; and a second layer of metal contacting each of said mesa regions, and the side-walls and conductive material in each of said trenches, said second layer of metal forming Schottky contacts where it contacts said mesa regions, said second layer of metal providing an anode connection point for said rectifier device;

said device structure arranged such that a voltage applied across said anode and cathode which is greater than the barrier height of said Schottky contacts allows current to flow from said anode to said cathode via said Schottky contacts, and a voltage applied across said anode and cathode which reverse-biases the device produces depletion regions alongside said side-walls and around said shallow P regions which provide potential barriers across said mesa regions that shield said Schottky contacts from a high electrical field and thereby reduce reverse leakage current, each of said shallow P regions protecting said trench corners from premature breakdown due to high electric fields and thereby improving the reliability of the trench oxide.

27. The high power rectifier device of claim 26, wherein said device resides on a die in which said drift layer, said N+ layer and said first and said second metal layers run the length and width of said die.

28. The high power rectifier device of claim 27, wherein each of said trenches is a channel which runs the length of said die and said trenches are spaced periodically across the width of said die.

29. The high power rectifier device of claim 27, wherein each of said trenches is approximately cylindrical about a vertical axis, said trenches spaced periodically within said die.

30. The high power rectifier device of claim 27, wherein the perimeter of each of said trenches describes a polygon, said trenches spaced periodically within said die.

31. The high power rectifier device of claim 27, wherein said N+ layer is a bulk substrate material and said N− drift layer is an epitaxial layer grown to a desired thickness on said N+ layer.

32. The high power rectifier device of claim 27, wherein said − drift layer is a bulk substrate material and said N+ layer is implanted or diffused into the backside of said N− drift layer and has a thickness of less than about 0.5 $\mu$m.

33. The high power rectifier device of claim 26, wherein the surface area of said die is about 0.1 cm$^2$ and said rectifier device can accommodate a current of at least 50 A when forward-biased.

34. The high power rectifier device of claim 26, wherein said N+ layer and said N− drift layer comprise a semiconductor material having a bandgap voltage greater than that of silicon.

35. The high power rectifier device of claim 26, wherein said N+ layer and said N− drift layer comprise silicon carbide (SiC).

36. The high power rectifier device of claim 35, wherein said N− drift layer has a thickness of about 12 μm and said rectifier device has a blocking voltage of at least 1200 volts.

37. The high power rectifier device of claim 26, wherein the doping density in said mesa regions is at least four times greater than the doping density in the portion of said − drift layer below said mesa regions, said higher doping density lowering the on-resistance of said device in said mesa regions, said oxide side-walls acting as field plates which reduce the peak field present in said mesa regions when said device is in blocking mode such that said higher doping density in said mesa regions does not significantly degrade said device's blocking capability.

38. The high power rectifier device of claim 26, wherein the doping density in said mesa regions is less than the doping density in the portion of said N− drift layer below said mesa regions, said lower doping density increasing the blocking voltage and reducing the leakage current of said device.

39. The high power rectifier device of claim 26, wherein said trenches are recessed vertically into said N− drift layer such that said side-walls are approximately perpendicular to the top surface of said drift layer.

* * * * *